(12) United States Patent
Siemieniec et al.

(10) Patent No.: US 9,070,790 B2
(45) Date of Patent: Jun. 30, 2015

(54) VERTICAL SEMICONDUCTOR DEVICE AND METHOD OF MANUFACTURING THEREOF

(71) Applicant: Infineon Technologies AG, Neubiberg (DE)

(72) Inventors: Ralf Siemieniec, Villach (AT); Jens Peter Konrath, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/013,180

(22) Filed: Aug. 29, 2013

(65) Prior Publication Data

US 2015/0061089 A1    Mar. 5, 2015

(51) Int. Cl.
*H01L 29/861* (2006.01)
*H01L 21/266* (2006.01)
*H01L 29/66* (2006.01)

(52) U.S. Cl.
CPC ............ *H01L 29/861* (2013.01); *H01L 21/266* (2013.01); *H01L 29/66121* (2013.01); *H01L 29/8618* (2013.01)

(58) Field of Classification Search
CPC ................ H01L 29/8618; H01L 29/66121
USPC .................................................. 257/362, 497
See application file for complete search history.

(56) References Cited

U.S. PATENT DOCUMENTS

| | | | |
|---|---|---|---|
| 6,017,778 A * | 1/2000 | Pezzani | 438/138 |
| 6,580,142 B1 * | 6/2003 | Pezzani | 257/500 |
| 8,338,915 B2 * | 12/2012 | Mallikararjunaswamy et al. | 257/577 |
| 8,471,337 B2 * | 6/2013 | Jensen et al. | 257/339 |
| 2011/0248286 A1 | 10/2011 | Onose | |
| 2012/0018846 A1 * | 1/2012 | Baburske et al. | 257/587 |
| 2013/0270606 A1 * | 10/2013 | Chen et al. | 257/183 |
| 2014/0065787 A1 * | 3/2014 | Happ et al. | 438/382 |

FOREIGN PATENT DOCUMENTS

DE    102009047808 A1    5/2011

* cited by examiner

*Primary Examiner* — George Fourson, III
(74) *Attorney, Agent, or Firm* — Murphy, Bilak & Homiller, PLLC

(57) ABSTRACT

A vertical semiconductor device has a semiconductor body with a first surface and a second surface substantially parallel to the first surface. A first metallization is arranged on the first surface. A second metallization is arranged on the second surface. In a sectional plane perpendicular to the first surface, the semiconductor body includes an n-doped first semiconductor region in ohmic contact with the second metallization, a plurality of p-doped second semiconductor regions in ohmic contact with the first metallization, and a plurality of p-doped embedded semiconductor regions. The p-doped second semiconductor regions substantially extend to the first surface, are spaced apart from one another and form respective first pn-junctions with the first semiconductor region. The p-doped embedded semiconductor regions are spaced apart from one another, from the p-doped second semiconductor regions, from the first surface and from the second surface, and form respective second pn-junctions with the first semiconductor region.

16 Claims, 6 Drawing Sheets

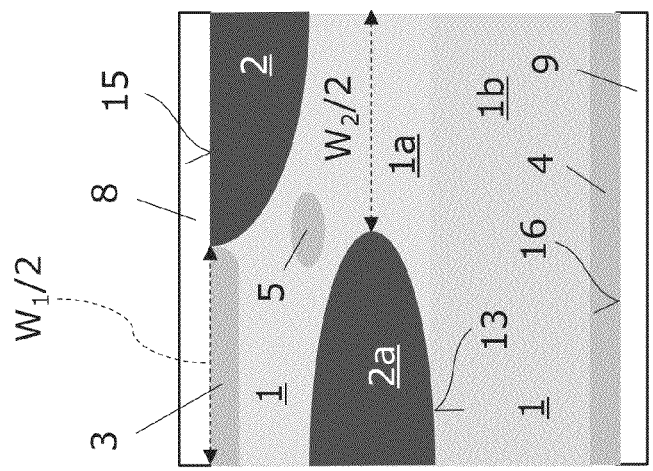
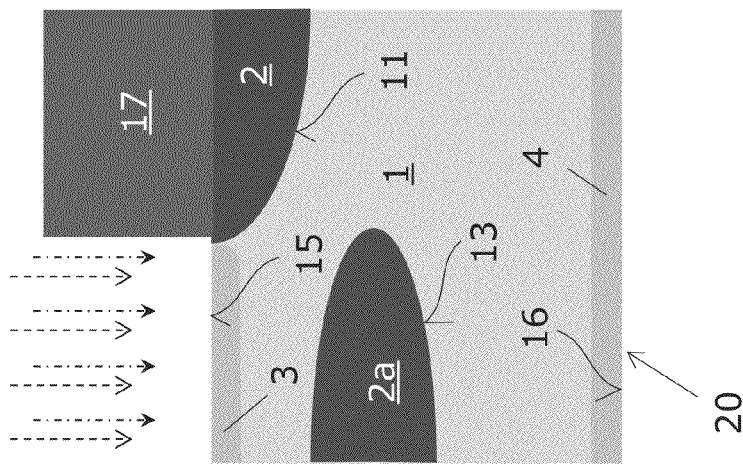
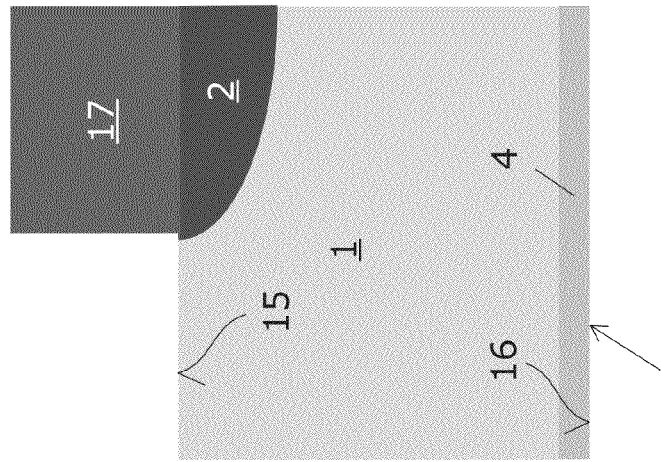

VERTICAL SEMICONDUCTOR DEVICE AND METHOD OF MANUFACTURING THEREOF

TECHNICAL FIELD

Embodiments of the present invention relate to vertical semiconductor devices, in particular to vertical semiconductor diodes, and to related methods for producing vertical semiconductor devices.

BACKGROUND

Diodes, such as free-wheeling diodes that are used in frequency converters for motor control, are often desired to have a low threshold voltage and a soft recovery behavior during turn-off or changeover. In a series of applications, in particular in traction technology, a high surge current strength and avalanche current strength, respectively, of the components is additionally required. In specific operating states that may be unintended but often unavoidable, particularly in the event of relatively long operation (e.g. recharging of the intermediate circuit after a short circuit), high over-currents can arise, e.g. in the frequency converter on the input side. For power diodes having a high blocking capability, this means that they should be designed to momentarily tolerate very high currents in the forward direction. In addition, the switching losses and delays during changeover caused by stored charges should be as low as possible. Schottky diodes have a very low amount of stored charges, a low the threshold voltage and a low on-state resistance Ron (forward voltage drop), and are often used in high frequency applications. Due to the unipolar character (i.e. no bipolar injection), the avalanche stability, the surge current stability of Schottky diodes is however limited. In MPS diodes (i.e. Merged PiN Schottky diodes), Schottky contacts alternate with pn-junctions connected in parallel. The pn-junctions protect the Schottky contacts during the off-state (i.e. during reverse biasing of the pn-junctions and the Schottky contacts). Furthermore, the pn-junctions contribute to the forward current above a threshold voltage drop of, for example 3 V, for silicon carbide (SiC) MPS diodes. Accordingly, MPS diodes can carry higher forward currents and have a better avalanche stability and a lower leakage current than Schottky diodes. However, the characteristics of Schottky contacts are typically more sensitive to manufacturing variations than pn-junctions.

For these and other reasons, improvements are needed.

SUMMARY

According to an embodiment of a vertical semiconductor device, the vertical semiconductor device includes a semiconductor body having a first surface and a second surface which runs substantially parallel to the first surface. A first metallization is arranged on the first surface. A second metallization is arranged on the second surface. In a sectional plane substantially perpendicular to the first surface, the semiconductor body further includes: an n-doped first semiconductor region in ohmic contact with the second metallization; a plurality of p-doped second semiconductor regions in ohmic contact with the first metallization, and a plurality of p-doped embedded semiconductor regions. The p-doped second semiconductor regions substantially extend to the first surface, are spaced apart from one another and form respective first pn-junctions with the first semiconductor region. The p-doped embedded semiconductor regions are spaced apart from one another, from the p-doped second semiconductor regions, from the first surface and from the second surface, and form respective second pn-junctions with the first semiconductor region.

According to an embodiment of an n-channel semiconductor diode, the n-channel semiconductor diode includes: a semiconductor body of a semiconductor material having a band-gap higher than about two electron volts and extending between a first surface and a second surface which runs substantially parallel to the first surface; an anode metallization arranged on the first surface; and a cathode metallization arranged on the second surface. In a sectional plane substantially perpendicular to the first surface, the semiconductor body incudes: an n-doped first semiconductor region in ohmic contact with the cathode metallization; at least two p-doped second semiconductor regions in ohmic contact with the anode metallization, spaced apart from one another, and forming respective first pn-junctions with the first semiconductor region; and at least one p-doped embedded semiconductor region in ohmic contact with the anode metallization. The at least one p-doped embedded semiconductor region forms a second pn-junction with the first semiconductor region, and is arranged in a direction substantially perpendicular to the first surface between the second surface and the at least two p-doped second semiconductor regions. In a projection onto the first surface, at least a portion of the at least one p-doped embedded semiconductor region is arranged between two of the at least two p-doped second semiconductor regions.

According to an embodiment of a method for producing a vertical semiconductor device, the method includes: providing a semiconductor substrate having a first surface and an n-doped first semiconductor layer; forming a hard mask, which includes openings defining first zones in the n-doped first semiconductor layer, on the first surface; implanting acceptor ions of a first maximum energy through the hard mask into the first zones; replacing the hard mask by an inverted mask which includes openings which are substantially complementary to the openings of the hard mask; implanting acceptor ions of a second maximum energy different than the first maximum energy through the inverted mask into second zones of the n-doped first semiconductor layer; and carrying out at least one temperature step to activate the acceptor ions in the first zones and the second zones.

Those skilled in the art will recognize additional features and advantages upon reading the following detailed description, and upon viewing the accompanying drawings.

BRIEF DESCRIPTION OF THE DRAWINGS

The components in the Figures are not necessarily to scale, instead emphasis is placed upon the principles illustrated therein.

FIG. 5A to FIG. 6C illustrates vertical cross-sections through a semiconductor body during method steps of a method according to embodiments.

DETAILED DESCRIPTION

Figure 1:
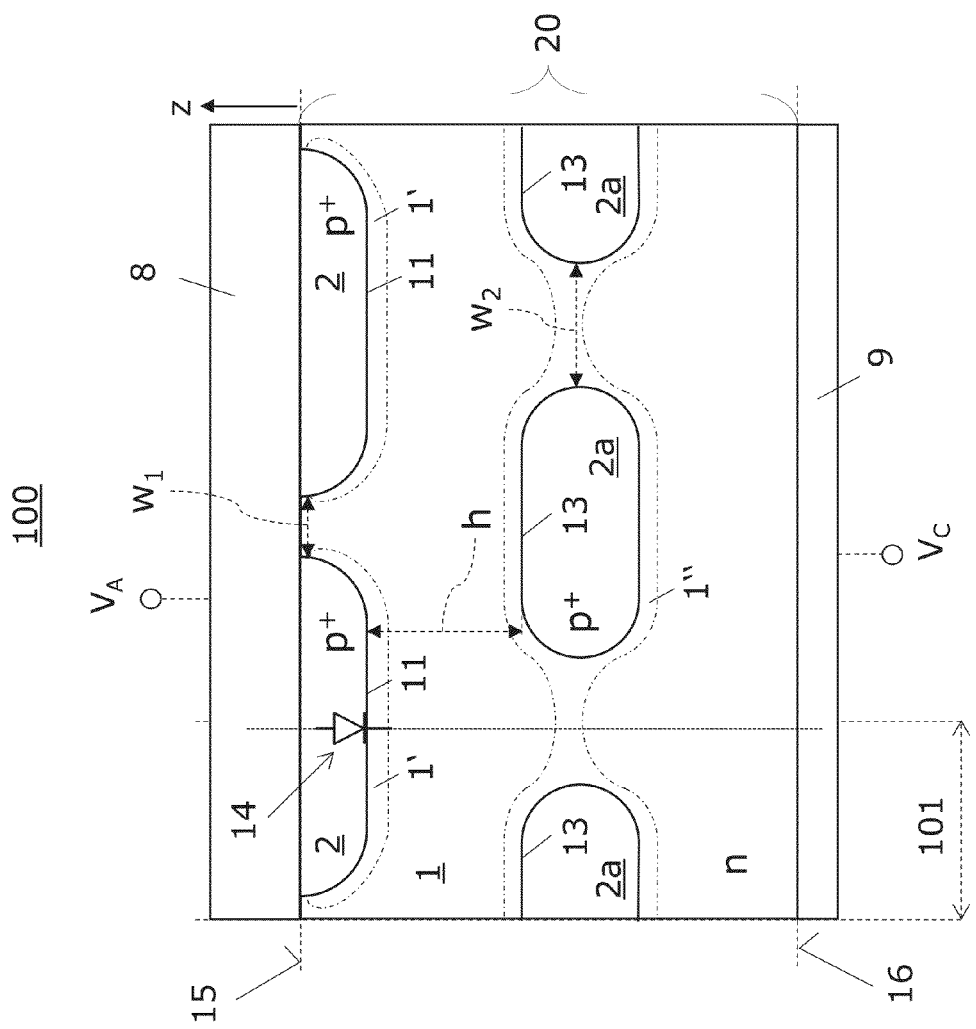
FIG. 1 illustrates a cross-section through a semiconductor body of a vertical semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. Other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation that is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "$n^-$" means a doping concentration that is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, unipolar semiconductor devices such as n-channel diodes and JFETs, in particular to vertical power n-channel diodes, and to manufacturing methods therefor.

In the context of the present specification, the terms "substantially unipolar semiconductor device" and "unipolar semiconductor device" intend to describe a semiconductor device with a load current at a rated current density and lower current densities that is unipolar or at least substantially unipolar. At high current densities above the rated load current, e.g. in an event of a surge current, the current may become bipolar, i.e. is carried partly by electrons and partly by holes, that is to say at least partly flows via a pn junction.

Typically, the semiconductor device is a power semiconductor device having an active area with a plurality of diode-cells for rectifying a load current between two load metallization. Furthermore, the power semiconductor device may have a peripheral area with at least one edge-termination structure at least partially surrounding an active area of diode-cells when seen from above.

The term "power semiconductor device" as used in this specification intends to describe a semiconductor device on a single chip with high voltage and/or high current switching capabilities. In other words, power semiconductor devices are intended for high current, typically in the range of one or more Amperes and/or high voltages, typically above 100 V, more typically above 400 V.

In the context of the present specification, the terms "in ohmic contact," in resistive electric contact" and "in resistive electric connection" intend to describe that there is an ohmic current path between respective elements or portions of a semiconductor device at least when no voltages or only low testing voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously. In some embodiments, the resistivity of a low resistive current path between respective elements or portions of a semiconductor device which is low when low voltages are applied to and/or across the semiconductor device, for example a probe voltage of less than one or a few volts, becomes high above a threshold voltage, for example due to depleting a semiconductor region forming at least a part of the current path.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu, and Mo, or a metal alloy such as NiAl, but may also be made of a material with metallic or near metallic properties with respect to electric conductivity such as highly doped n-type or p-type poly-Si, TiN, an electrically conductive silicide such as $TaSi_2$, $TiSi_2$, $PtSi$, $WSi_2$, $MoSi$, or an electrically conductive carbide such as AlC, NiC, MoC, TiC, PtC, WC or the like. The metallization may also include different electrically conductive materials, for example a stack of those materials.

In the context of the present specification, the term "depletable region" or "depletable zone" is intended to describe the fact that the corresponding semiconductor region or the corresponding semiconductor zone is substantially fully depleted (substantially free of free charge carriers) during the off state of the semiconductor component with an applied reverse voltage lying above a given threshold value. For this purpose, the doping charge of the depletable region is set accordingly and, in one or more embodiments, the depletable region is a weakly doped region. In the off state, the depletable region(s) form depleted region(s), also referred to as space charge region(s), typically a contiguous depleted zone, whereby the current flow between two electrodes or metallizations connected to the semiconductor body can be prevented.

In the following, embodiments pertaining to semiconductor devices and manufacturing methods for forming semiconductor devices are explained mainly with reference to silicon carbide (SiC) semiconductor devices having a monocrystalline SiC semiconductor body. Accordingly, a semiconductor region or layer is typically a monocrystalline SiC-region or SiC-layer if not stated otherwise. However, the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaP), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe). The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications, mainly Si, SiC, GaAs and GaN materials are used. If the semiconductor body is made of a wide band-gap material, i.e. of a semiconductor material with a band-gap of at least about two electron volts such as SiC or GaN and having a high breakdown field strength and high critical avalanche field strength, respectively, the doping of the respective semiconductor regions can be chosen higher which reduces the on-state resistance $R_{on}$.

FIG. 1 shows, in a vertical cross-section, a first embodiment of a vertical semiconductor device 100 having a semiconductor body 20. On the first surface 15 a first metallization or first electrode 8 and on the second surface 16 a second metallization or second electrode 9 are arranged, respectively, typically over the whole active area. The direction of the normal to the first surface 15 defines a vertical direction z. The semiconductor body 20 contains an n-doped first semiconductor region or semiconductor layer 1 that is in ohmic contact with the second metallization 9. Two p-doped second semiconductor regions 2 are partly embedded in the first semiconductor region 1 and in ohmic contact with the first metallization 8. Accordingly, bipolar current path(s) may be formed between the first metallization 8, also referred to an anode metallization 8, and the second metallization 9, also referred to a cathode metallization 9. This is indicated by the diode symbol 14 and the dotted vertical line in FIG. 1. In the following, the p-doped second semiconductor regions 2 are also referred to as anode emitter regions 2.

The second semiconductor regions 2 typically extend to the first surface 15 and are spaced apart from one another and form respective first pn-junctions 11 with the first semiconductor region 1. Typically, the first pn-junctions 11 extend to the first surface 15.

To form an ohmic contact with the second semiconductor regions 2 and the first metallization 8, a sufficiently high doping of the second semiconductor regions 2 is selected. Alternatively, a sufficiently highly p-doped additional contact portion (not shown) may be arranged between each of the two second semiconductor regions 2 and the first metallization 8. In the exemplary embodiment in FIG. 1, the second semiconductor regions 2 are $p^+$-doped and directly adjoin the first metallization 8.

Likewise, the doping of the first semiconductor region 1 is typically sufficiently high in the n-type contact portions of the first semiconductor region 1 adjoining the first metallization 8 and the second metallization 9, respectively.

At low forward voltage drops between the first metallization 8 and the second metallization 9 ($V_C<V_A$), i.e. voltage drops below the threshold voltage of the diodes 14 (e.g. about 3 V for SiC-diodes), formed by the first pn junctions 11, the current in the forward direction can also flow completely as unipolar electron current. When the forward voltage drop $V_A-V_C$ is larger than the threshold voltage of the diodes 14, i.e. at currents densities above a rated current density, both bipolar current path(s) crossing the first pn-junctions and unipolar current path(s) running in the semiconductor body 20 from the first metallization 8 to the second metallization 9 only through n-doped semiconductor regions 1 contribute to the total current. However, during normal operation at and below the rated current density, the current is carried by electrons. Accordingly, the semiconductor device 100 is a unipolar semiconductor device during normal operation.

In the exemplary embodiment shown in FIG. 1, three p-doped embedded semiconductor regions 2a are completely embedded in the first semiconductor region 1, are spaced apart from one another, from the p-doped second semiconductor regions 2, from the first surface 15 and from the second surface 16, and form respective closed second pn-junctions 13 with the first semiconductor region 1. Although the p-doped embedded semiconductor regions 2a are spaced apart from the first surface 15 and the first metallization 8, respectively, the p-doped embedded semiconductor regions 2a are typically in ohmic contact with the first metallization 8. Accordingly, the p-doped embedded semiconductor regions 2a may also contribute to a bipolar current in the forward mode, in which the voltage $V_A$ applied to the anode metallization 8 is higher than the voltage $V_C$ applied to the cathode metallization 9. In the following, the anode metallization 8 and to the cathode metallization 9 are also referred to as anode 8 and to the cathode 9, respectively.

In the exemplary embodiment shown in FIG. 1, the p-doped embedded semiconductor regions 2a are also $p^+$-doped semiconductor regions. The maximum doping concentration of the p-doped embedded semiconductor regions 2a may be substantially equal to or more typically smaller than the maximum doping concentration of the second semiconductor regions 2.

The second semiconductor regions 2 and the embedded semiconductor regions 2a have typically a maximum dopant concentration greater than about $5*10^{18}/cm^3$. By virtue of the associated high emitter efficiency, a high overcurrent strength of diode 100 is ensured.

During the off-state or blocking mode ($V_C >= V_A$), space charge regions 1' and 1" are formed at the first pn-junctions 11 and the second pn-junctions 13 that extend into the first semiconductor region 1 and, due to the higher doping concentrations, to a lesser extent extend into the p-doped embedded semiconductor regions 2a and the second semiconductor regions 2, respectively.

The doping concentration of the first semiconductor region 1 is typically chosen such that the space charge region ends before the first surface 15 and the first metallization 8, respectively.

According to an embodiment, the arrangement of the p-doped embedded semiconductor regions 2a and the second semiconductor regions 2 and the doping relations of the p-doped embedded semiconductor regions 2a, the second semiconductor regions 2 and the first semiconductor region 1 are chosen such that a contiguous space charge region 1" is formed that prevents the current flow between the anode metallization 8 and the cathode metallization 9 (i.e. electrically insulates the two metallizations 8, 9), when a reverse voltage drop $V_C - V_A > 0$ V is applied between the cathode metallization 9 and the anode metallization 8. In this arrangement, unipolar current path(s) are formed between the cathode metallization 9 and the anode metallization 8, when a forward voltage drop $V_A - V_C$ that is larger than a pinch-off voltage $V_{pinch-off}$ of the semiconductor device ($V_A - V_C > V_{pinch-off}$) is applied between the cathode metallization 9 and the anode metallization 8 that is smaller than a threshold voltage of the load pn-junction(s) 11 (pn-diode 14) of the same semiconductor material. For this purpose, the first semiconductor region 1 may include depletable areas arranged between adjacent p-doped second semiconductor regions 2, between adjacent p-doped embedded semiconductor regions 2a and/or between adjacent pairs of p-doped embedded semiconductor regions 2a and p-doped second semiconductor regions 2.

Accordingly, the semiconductor device 100 may be operated as a low-leakage-current and low forward threshold voltage semiconductor diode. Since the unipolar current path(s) running through n-doped regions 1 only is constricted by applying a reverse voltage, the semiconductor device 100 is also referred to as n-channel semiconductor diode.

Due to the unipolar current path(s), the overall emitter efficiency is reduced at and below the rated current density compared to bipolar diodes. This permits a much better soft recovery behavior of the semiconductor device 100.

The forward threshold voltages $V_{th2}$ of a SiC semiconductor diode 100 may be, for example, about 1.5 V. Due to the p-doped embedded semiconductor regions 2a and the second semiconductor regions 2, the diode 100 can carry high surge currents in the on-state (forward mode) and can carry high avalanche currents in the off-state (off-mode). Note that FIG. 1 typically corresponds to a small section of an active area of a power diode 100 having a plurality of the second semiconductor regions 2 and a plurality of p-doped embedded semiconductor regions 2a that are arranged vertically below the second semiconductor regions 2 and horizontally offset to the second semiconductor regions 2. In this embodiment, the plurality of second semiconductor regions 2 typically form a first lattice or first grid and the plurality of embedded semiconductor regions 2a typically forms a horizontally off-set second lattice or second grid with substantially the same lattice constant. The numeral 101 in FIG. 1 denotes a unit cell of such a vertical power diode.

The first and second grids can be one-dimensional grids of bar-shaped second semiconductor regions 2 and bar-shaped p-doped embedded semiconductor regions 2a, respectively, when seen from above. Alternatively, the second semiconductor regions 2 and the embedded semiconductor regions 2a may be substantially ring-shaped when seen from above. Alternatively, the second semiconductor regions 2 and the embedded semiconductor regions 2a may be shaped as polygons, circles or ellipsoids when seen from above.

Furthermore, the semiconductor device 100 may efficiently be manufactured with low process variations, in particular regarding the width of channel regions. This is explained below with regard to FIG. 5A to FIG. 6C.

In the exemplary embodiment in FIG. 1, the current preventing contiguous space charge region 1" is first formed in the off-state between the p-doped embedded semiconductor regions 2a.

In other embodiments, the current preventing contiguous space charge region is first formed in the off-state between the p-doped second semiconductor regions 2.

In still other embodiments, the current preventing contiguous space charge region is first formed in the off-state between adjacent p-doped second semiconductor regions 2 and p-doped embedded semiconductor regions 2a.

The area that the current preventing contiguous space charge region first forms mainly depends on doping relations, the vertical distance h between the p-doped second semiconductor regions 2 and p-doped embedded semiconductor regions 2a, the horizontal distance (first minimum distance) $w_1$ between adjacent p-doped second semiconductor regions 2, and the horizontal distance (second minimum distance) $w_2$ between adjacent p-doped embedded semiconductor regions 2a.

Note that similar SiC diodes without the p-doped embedded semiconductor regions 2a can reliably be manufactured using current SiC technology with comparatively wide channel regions only. This is due to a typical minimum process variation of about 100 nm. However, a normally-off behavior of such a SiC diode is only possible with narrow channel regions. Numerical simulation for a SiC diode without the p-doped embedded semiconductor regions 2a shows that blocking voltage drops sharply at a process variation (mask accuracy) of about 50 nm for a designed horizontal distance (corresponds to $w_1$) between the respective adjacent anode emitter zones of about 500 nm (a process variation of less than about 25 nm may be sufficient). Furthermore, such a SiC diode would have a forward threshold voltage of about 2 V. Different thereto, numerical simulation (not presented) of semiconductor device 100 shows that forward threshold voltages of about 1.6V to 1.4V and less and high blocking voltages of for example about 800 V are achievable with current technology (100 nm process variation). This is attributable to additionally using the p-doped embedded semiconductor regions 2a for constricting channel portions of the first semiconductor region 1 and to the self-aligned manufacturing process explained below.

In embodiments in which the unipolar current path(s) are horizontally constricted in the off-state as illustrated in FIG. 1, a particular low forward threshold voltage may be achieved by choosing a vertical distance h that is larger than the first minimum distance $w_1$ and the second minimum distance $w_2$.

Furthermore, the first minimum distance $w_1$ and the second minimum distance $w_2$ may substantially match.

Typically, the first minimum distance $w_1$ is larger than about 100 nm, and may be larger than about 500 nm and even larger than about 1 μm.

To avoid high field strength in the off-state, the first pn-junctions 11 and the second pn-junctions 13 have typically no sharp edges.

In the exemplary embodiment in FIG. 1, the embedded semiconductor regions 2a are arranged in a horizontal plane forming a mirror plane of the embedded semiconductor regions 2a, and a horizontal distance between the embedded semiconductor regions 2a varies with the depth and has its minimum value $w_2$ in the horizontal plane.

Typically, the second minimum distance $w_2$ is larger than about 100 nm, and may be larger than about 500 nm and even larger than about 1 μm.

In the exemplary embodiment in FIG. 1, the p-doped embedded semiconductor regions 2a partly overlaps with two of the second semiconductor regions 2 when seen from above and in a projection in a projection onto the first surface 15.

To ensure low forward threshold voltage while maintaining a high blocking voltage and avoiding a punch-through linked to a strongly increased leakage current, at least a portion of the p-doped embedded semiconductor regions 2a is, in the projection onto the first surface 15, arranged between two of p-doped second semiconductor regions 2.

Likewise, at least a portion of the second pn-junction 13 is, in the projection onto the first surface 15, arranged between two first pn-junctions 11.

Figure 2:
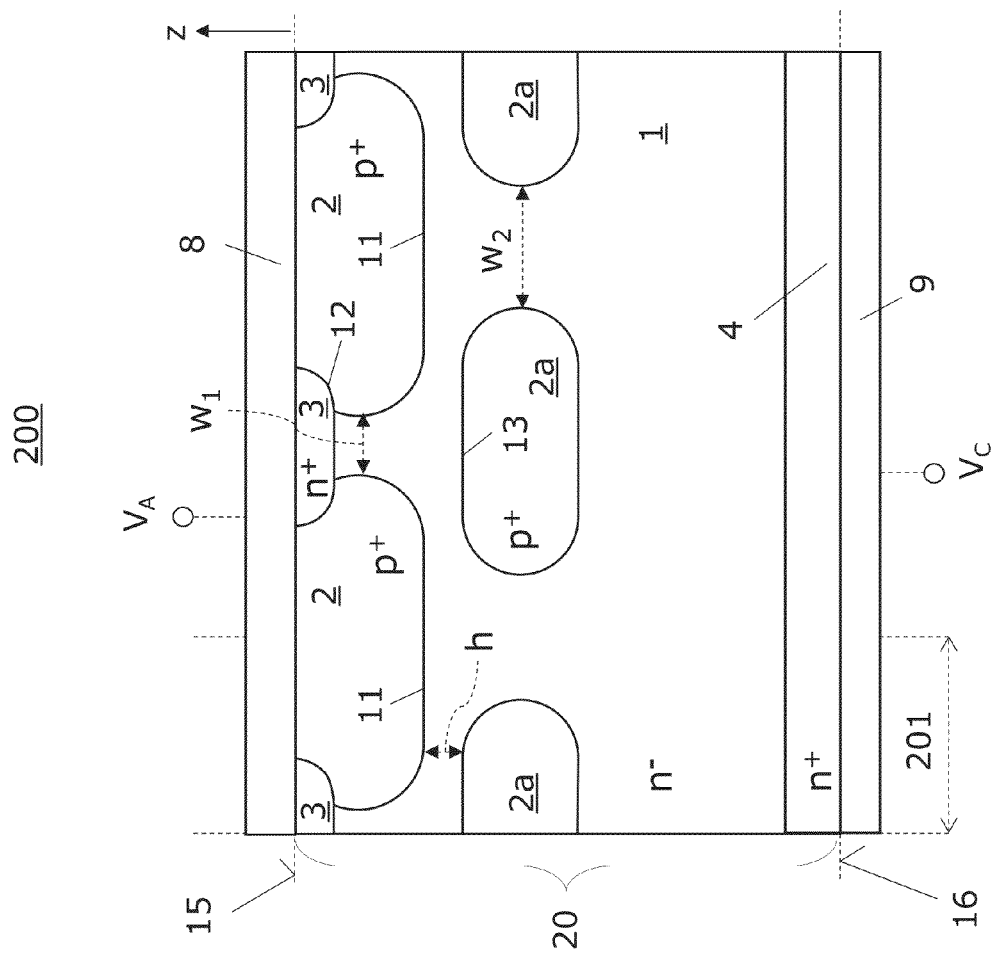
FIG. 2 illustrates a cross-section through a semiconductor body of a vertical semiconductor device according to an embodiment.

FIG. 2 illustrates a vertical cross-section through a vertical semiconductor device 200. The semiconductor device 200 is similar to the semiconductor device 100 explained above with regard to FIG. 1 and may also be operated as a diode. As can be seen in the vertical sectional view of FIG. 2, the unipolar current path(s) of the semiconductor device 200 runs from the anode 8, via an n-doped third semiconductor region 3 in ohmic contact with the anode 8, which adjoins the anode 8 at the first surface 15 and is arranged between the two shown anode emitter regions 2 and the first semiconductor region 1 or base region 1, via the first semiconductor region 1, and via an the n-doped fourth semiconductor region 4 to the cathode 9. The n-doped third semiconductor regions 3 and the n-doped fourth semiconductor region 4 have a higher maximum doping concentration than the first semiconductor region 1. Typically the semiconductor device 200 includes a plurality of n-doped third semiconductor regions 3 alternating with the anode emitter regions 2. The n-doped third semiconductor regions 3 and the n-doped fourth semiconductor region 4 may also be considered as n-doped first contact portions 3 and n-doped second contact portion 4 of the first semiconductor region 1.

The first contact portions 3 (i.e. third semiconductor regions) typically extend vertically less deeply into the semiconductor body 20 than the anode emitter regions 2. The ratio of the vertical extent of the first contact portions 3 to the vertical extent of the anode emitter regions 2 can be e.g. in a range of approximately 1:10 to approximately 1:3. Moreover, the first contact portions 3 typically form respective pn-junctions 12 with adjacent anode emitter zones 2.

In one exemplary embodiment, the doping of the first contact portions 3 is high enough to avoid the formation of a Schottky contact between the first semiconductor region 1 and the anode 8. By way of example, both the maximum dopant concentration of the n-doped second contact portion 4 and the maximum dopant concentration of the n-doped first contact portions 3 can exceed the value of approximately $10^{19}$ $cm^{-3}$.

In the exemplary embodiment illustrated in FIG. 2, the first minimum distance $w_1$ between the second semiconductor regions 2 is at a depth between about 30% and 70% of the maximum vertical extension of the second semiconductor regions 2.

In another embodiment, the first metallization 8 adjoins (i.e. is in ohmic contact with) only the second semiconductor regions 2 but not the first contact portions 3 that are in ohmic contact with (typically adjoining) a third metallization arranged on the first surface 15, spaced apart from the first metallization 8, an typically forming a source metallization. In this embodiment, first metallization 8 forms a gate metallization so that the semiconductor device 200 may be operated as a normally-off or normally-on JFET.

Figure 3:
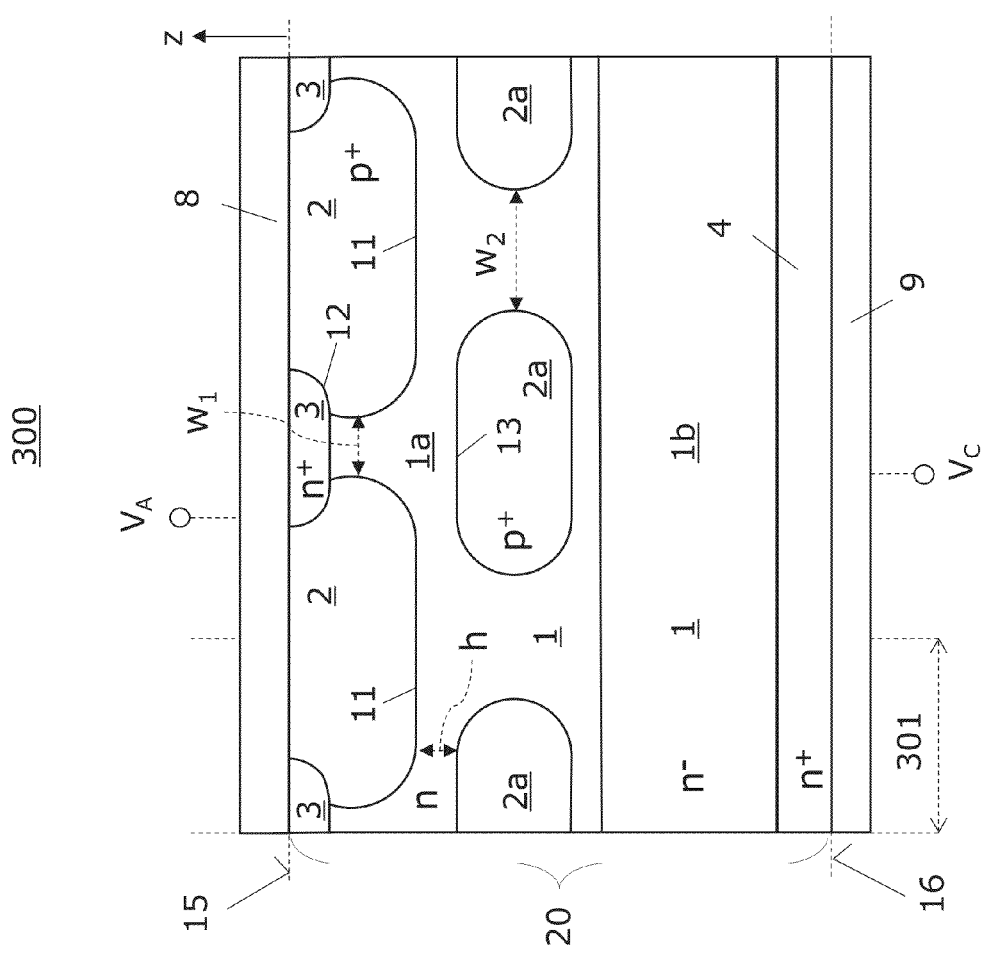
FIG. 3 illustrates a cross-section through a semiconductor body of a vertical semiconductor device according to an embodiment.

FIG. 3 illustrates a vertical cross-section through a vertical semiconductor device 300. The semiconductor device 300 is similar to the semiconductor device 200 explained above with regard to FIG. 2 and may also be operated as a diode. However, the first semiconductor region 1 of semiconductor device 300 includes an n-doped drift portion 1b and an n-doped current-spread portion 1a arranged between the anode 8 and the drift portion 1b, and having a lower maximum doping concentration than the current-spread portion 1a. Due to the higher doped current-spread portion 1a, the forward voltage drop and the on-state resistance Ron, respectively, of semiconductor device 300 is typically very low.

In the exemplary embodiment illustrated in FIG. 3, the embedded semiconductor regions 2a are completely embedded in the current-spread portion 1a. Further, the current-spread portion 1a forms a load-part of the first pn-junctions 11 with the second semiconductor regions 2. Typically, the current-spread portion 1a extends at least to the embedded semiconductor regions 2a.

Figure 4C:
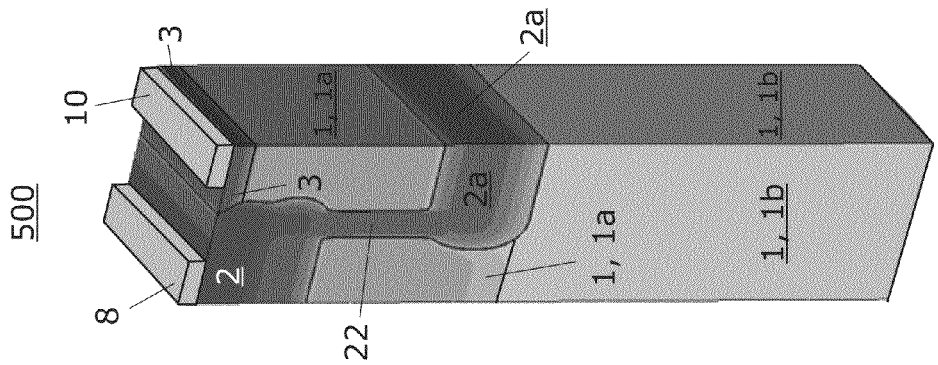
FIG. 4C illustrates a perspective view of a part of a vertical semiconductor device according to an embodiment.
Figure 4B:
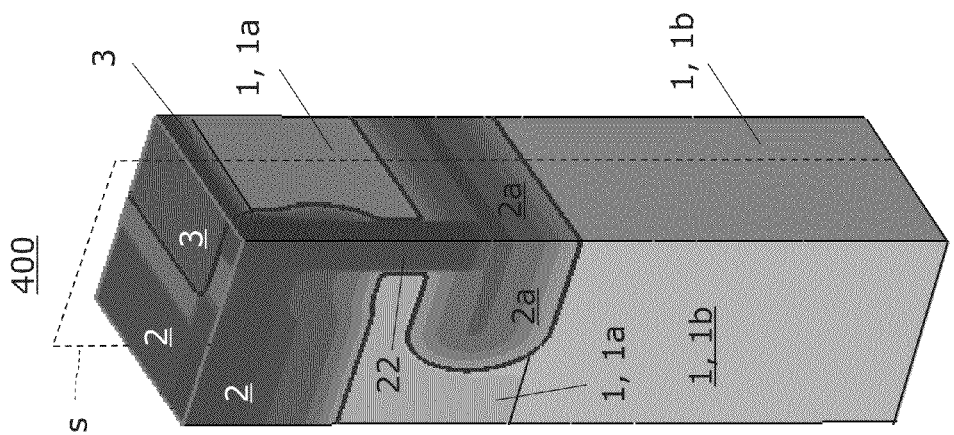
FIG. 4B illustrates a perspective view of a part of the vertical semiconductor device illustrated in FIG. 4A according to an embodiment.
Figure 4A:
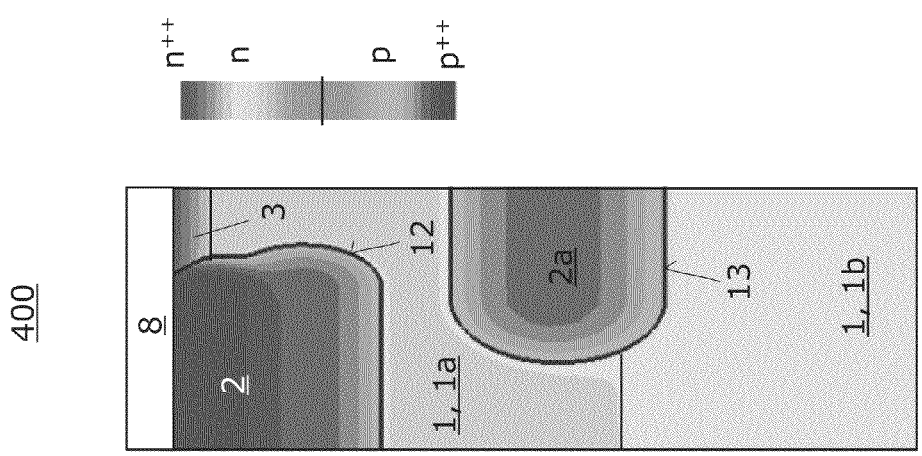
FIG. 4A illustrates a cross-section through a semiconductor body of a vertical semiconductor device according to an embodiment.

With regard to FIG. 4A and FIG. 4B, further embodiments are explained. FIG. 4A illustrates an upper vertical section through a unit cell of vertical semiconductor device 400. The semiconductor device 400 is similar to the semiconductor device 300 explained above with regard to FIG. 3 and may also be operated as a diode. However, the embedded semiconductor regions 2a extends to the drift portion 1b of the first semiconductor region 1. This facilitates the horizontal constriction of the channel region between adjacent embedded semiconductor regions 2a.

FIG. 4B illustrates a perspective view of a part of the vertical semiconductor 400. The unit cell illustrated in FIG. 4A may correspond to a section of the vertical plane s in FIG. 1B. As shown in FIG. 4B, the p-doped embedded semiconductor region(s) 2a is typically in ohmic contact with the first metallization (not shown in FIG. 4B) via a typically highly p-type semiconductor region 22 arranged between the second semiconductor region 2 and the embedded semiconductor regions 2a and forming a conductive connection. Typically, the p-type semiconductor region(s) 22 is only formed in one or a few a comparatively small connection areas, when seen from above.

FIG. 4C illustrates a perspective view of a unit cell of a vertical semiconductor 500. The semiconductor device 500 is similar to the semiconductor device 400 explained above with regard to FIG. 4A and FIG. 4B. However, instead of one contiguous first metallization covering (adjoining) the first contact portion(s) 3 and the second semiconductor region(s) 2, the semiconductor device 400 has a first metallization 8 and a second metallization 10 which are both arranged on the first surface but not in contact with each other. The first metallization 8 of the semiconductor device 500 is in ohmic contact with the second semiconductor region(s) 2 and via the typically highly p-type semiconductor region 22 with the embedded semiconductor region(s) 2a, but not with the first contact portion(s) 3 and the current-spread portion 1a (first semiconductor region 1), respectively. The third metallization 10 is in ohmic contact with the first contact portion(s) 3 and the current-spread portion 1a (first semiconductor region 1). Accordingly, the semiconductor device 500 is a three-terminal semiconductor device that may be operated as a normally-off or normally-on JFET with the first, second and third metallization 8, 9, 10 typically forming a source terminal 3, a drain terminal 9 and a gate terminal 10, respectively.

According to an embodiment, the p-type semiconductor region 22 between the second semiconductor region 2 and the embedded semiconductor region 2a of the JFET 500 is only formed in one or a few small connection areas, when seen from above. Typically, a maximum horizontal extension of the p-type semiconductor region 22 is at least three times smaller, more typically at least ten times smaller, and even more typically at least 25 times smaller than a maximum horizontal extension of the embedded semiconductor region 2a and/or a maximum horizontal extension of the second semiconductor region 2. For example, the first contact portion 3, the embedded semiconductor region 2a and the second semiconductor region 2 are shaped as elongated bars, when seen from above, and the p-type semiconductor region 22 is shaped as a circle or a compact polygon such as a regular hexagon when seen from above. In this embodiment, such a compact p-type semiconductor region 22 may be arranged between each of two respective end portions of the embedded semiconductor region 2a and the second semiconductor region 2 next to a peripheral area and an edge of the semiconductor body, respectively. In embodiments in which several compact p-type semiconductor regions 22 are used between a pair of an embedded semiconductor region 2a and an adjacent second semiconductor region 2, the sum of the maximum horizontal extensions of the several compact p-type semiconductor regions 22 is typically at least three times smaller, more typically at least ten times smaller than the maximum horizontal extension of the embedded semiconductor region 2a and/or the maximum horizontal extension of the second semiconductor region 2. This is to ensure a low on-state resistance Ron of the JFET 500.

With regard to FIG. 5A to FIG. 6C, method steps of a method for forming a semiconductor device 100 are illustrated in respective vertical cross-sections through a semiconductor body 20 which is typically a semiconductor wafer, respectively. For sake of clarity, each of the figures illustrates only one unit cell of one of a plurality of a semiconductor devices 100 which are typically manufactured in parallel on wafer-level.

In a first step, a wafer 20, for example a SiC-wafer, extending between a first surface 15 and a second surface 16 arranged opposite to the first surface 15 is provided. The wafer 20 may include a highly n-doped substrate 4 extending to the back surface 16 and one or more epitaxial layers of the first conductivity type forming a first semiconductor layer 1 on the substrate 4 and extending to the first surface 15. In the semiconductor device 100 to be manufactured, the substrate 4 and portions thereof, respectively, typically forms a contact layer or contact portion 4.

Thereafter, a hard mask 7, for example a silicon nitride mask or an silicon oxide mask, may be formed on the first surface 15. The hard mask 7 includes openings which defines first zones 2 in the n-doped first semiconductor layer 1.

Thereafter, acceptor ions of a first maximum energy may be implanted through the hard mask 7 into the first zones 2. This may include several first acceptor implantations with different energies. The resulting semiconductor structure 100 is illustrated in FIG. 5A.

Figure 5C:
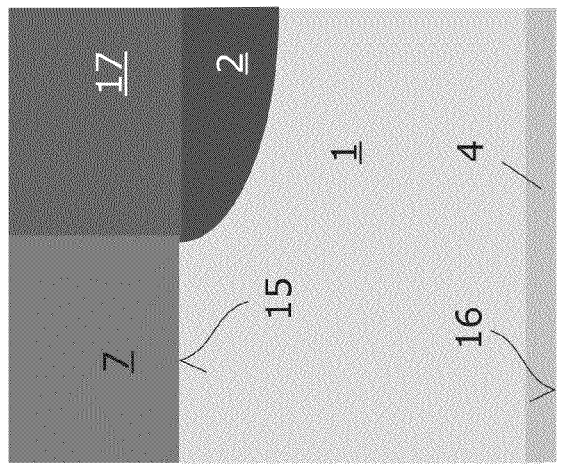
Figure 5B:
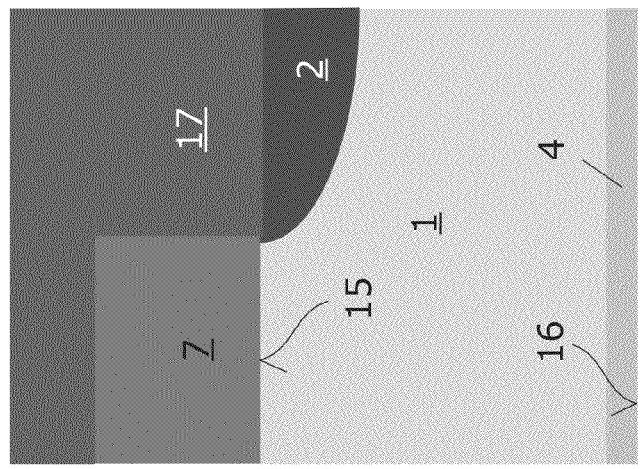
Figure 5A:
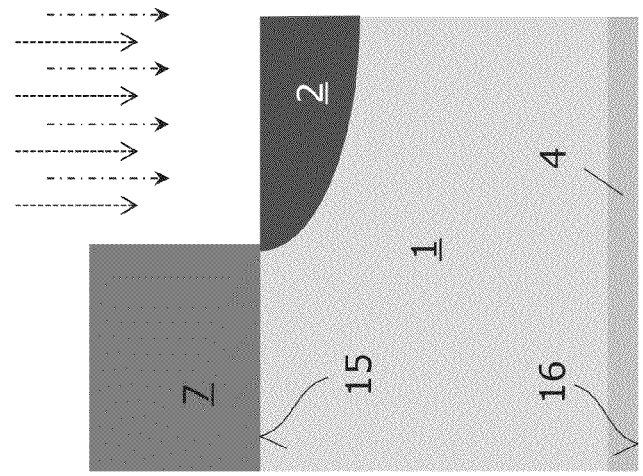

In exemplary embodiment shown in FIG. 5A, the one or more first acceptor implantations (represented by the dashed arrows) are performed such that a high acceptor dose is implanted close to the first surface 15. In other embodiments, the one or more first acceptor implantations are performed such that a high acceptor dose is implanted only in first zones (2a) which are spaced apart from the first surface 15 and the second surface 16.

As indicated by the dotted arrows in FIG. 5A, donor ions may be implanted through the hard mask 7 into lower zones of the first semiconductor layer 1 below the first zones 2. After a later thermal activating, the implanted donor ions may contribute to the increased conductivity of a current-spread portion.

Thereafter, the hard mask 7 is replaced by an inverted mask 17 having openings which are substantially complementary to the openings of the hard mask 7. This is typically done in a self-aligned manner.

Typically, replacing or the hard mask 7 includes forming a mask layer 17 on the hard mask 7. The resulting semiconductor structure 100 is illustrated in FIG. 5B.

Forming the mask layer 17 may include depositing of poly-silicon, diamond-like carbon (DLC) or a resin on the first surface 15 and the hard mask 7, respectively. Typically the material of the mask layer 17 is selectively etchable with respect to the material of the hard mask 7 and the material of the wafer 20.

In one embodiment, the hard mask 7 is partly etched back selectively to the semiconductor material of the wafer 20 to thin the hard mask 7 prior to forming the mask layer 17. This facilitates later forming equally spaced p-doped second semiconductor regions 2 and p-doped embedded semiconductor regions 2a in the first semiconductor layer 1 as the p-doped second semiconductor regions 2 and the p-doped embedded semiconductor regions 2a are to be formed in different depth using different maximum implanting energies. For example, the hard mask 7 may be partly back-etched between two of the first acceptor implantations.

Furthermore, the openings of the hard mask 7 may be widened, for example by etching, prior to forming the mask layer 17. Accordingly, the overlap, in projection onto the first surface 15, of the later formed p-doped second semiconductor regions 2 and p-doped embedded semiconductor regions 2a may be increased.

Alternatively, the width of the openings of the hard mask 7 may be reduced prior to forming the mask layer 17. Accordingly, the overlap, in projection onto the first surface 15, of the later formed p-doped second semiconductor regions 2 and the p-doped embedded semiconductor regions 2a may be reduced. Reducing the width of the openings of the hard mask 7 may be achieved by an isotropic deposition of hard mask material with a first height and subsequent anisotropic back-etching of the deposited hard mask material by the first height.

Thereafter, the mask layer 17 may be thinned using the hard mask 7 as a stop region. Typically, this includes a CMP-process (Chemical Mechanical Polishing/Planarization). The resulting semiconductor structure 100 is illustrated in FIG. 6C. Alternatively, a deposition-etch-deposition process sequence and a further dry-chemical etching may be used to form a plane mask surface.

Thereafter, the hard mask 7 may be removed from the first surface 15, for example by selective etching, to form the inverted mask 17 as illustrated in FIG. 6A.

As indicated by the dashed arrows in FIG. 6B, acceptor ions of a second maximum energy which is different to, and in the case of the exemplary process sequence, higher than, the first maximum energy are implanted through the inverted mask 17 into second zones 2a of the n-doped first semiconductor layer 1. This may include several second acceptor implantations with different energies.

In the exemplary embodiment shown in FIG. 6B, the minimum energy of the second acceptor implantations is higher than the minimum energy of the first acceptor implantations, and the maximum energy of the second acceptor implantations is higher than the maximum energy of the first acceptor implantations. Accordingly, the acceptor ions are in the second acceptor implantations mainly implanted in second zones 2a which are spaced apart the first surface 15 and extend vertically deeper into the wafer 20 than the first zones 2. The minimum energy of the second acceptor implantations may even be higher than the maximum energy of the first acceptor implantations.

As indicated by the dotted arrows in FIG. 6B, donor ions may be implanted through the inverted mask 17 into upper zones of the first semiconductor layer 1 above the second zones 2a and with a higher dose into third zones 3 of the first semiconductor layer 1 arranged above the second zones 2a and at or at least next to the first surface 15. After a later thermal activating, the implanted donor ions may contribute to the increased conductivity of a current-spread portion and a contact portion 3, respectively.

Thereafter, the inverted mask 17 may be removed, for example by etching.

Further, acceptor ions of a third maximum energy higher than the first maximum energy and lower than the second maximum energy are typically implanted into fourth zones (not shown in FIG. 6B but typically correspond to region 22 in FIG. 4B) of the first semiconductor layer 1 arranged between the first zones 2 and the second zones 2a of the first semiconductor layer 1. This is typically done by masked implantation using a further mask (not shown). After a later thermal activating, the implanted acceptor ions of the third maximum energy may form a p-type connection between the first zones 2 and the second zones 2a.

Furthermore, additional donor ions may be implanted into fifth zones 5 of the first semiconductor layer 1 arranged between the first zones 2 and the second zones 2a of the first semiconductor layer. This is typically done by masked implantation using an additional mask (not shown). After a later thermal activating, the implanted donor ions may compensate acceptor ions implanted into or in-diffusing during the later thermal activating into the designed n-channel portions between the first zones 2 and the second zones 2a.

Further donor ions may be mask-less implanted into one or more horizontal layers, for example between the first zones 2 and the second zones 2a, and/or below the second zones 2a. After a later thermal activating, the further donor ions may contribute to the increased conductivity of the current-spread portion. In one embodiment, the dopants for the current-spread portion are implanted by mask-less implantation only.

Thereafter, a high-temperature step may be carried out to activate the acceptor ions in the first zones 2 and the second zones 2a. Accordingly, spaced apart p-doped second semiconductor regions 2 substantially extending to the first surface 15 and p-doped embedded semiconductor regions 2a, which are spaced apart from one another, from the p-doped second semiconductor regions 2, from the first surface 15 and from the second surface 16, are formed in the first semiconductor layer 1 in a self-adjusted manner. Therefore, process variations are less important. In particular, a variation of the width of the openings in the hard mask (7) is compensated by a complementary variation width of the openings in the inverted mask (17). Accordingly, the sum of the first minimum distance $w_1$ between adjacent p-doped second semiconductor regions 2 and the second minimum distance $w_2$ between adjacent and p-doped embedded semiconductor regions 2a is substantially not altered by variation of the width of the openings in the hard mask, and thus for a given mask design substantially constant.

In the high-temperature step, the optionally implanted donor ions may also be activated to form a higher n-doped current-spread portion 1a and/or an n-doped first contact portion 3 in the first semiconductor layer 1. It is, however, also possible to use several high-temperature steps to activate dopants prior to further implantations.

Thereafter, a first metallization 8 in ohmic contact with the p-doped second semiconductor regions 2 may be formed on the first surface 15, typically at the first surface 15.

In embodiments in which a diode is to be manufactured, the first metallization 8 is also typically in ohmic contact with the first contact portions 3 and typically formed as a contiguous layer covering the p-doped second semiconductor regions 2 and the p-doped embedded semiconductor regions 2a when seen from above.

In embodiments in which a JFET is to be manufactured, the first metallization 8 is not in ohmic contact with the first contact portions 3 and only adjoins the p-doped second semiconductor regions 2 (but not the first contact portions 3). In these embodiments, a third metallization is typically formed on and in ohmic contact with the first contact portions 3. Forming the first metallization 8 and the third metallization typically includes depositing of a conductive material and masked etching the conductive material to form respective separated metallizations.

Thereafter, forming a second metallization 9 in ohmic contact with the n-doped first semiconductor layer 1 on the second surface 16, typically at the second surface 15 and as a contiguous layer. The resulting semiconductor device 200 is illustrated in FIG. 6C.

The methods explained above with regard to FIG. 5A to 6C allow for reliable manufacturing of semiconductor devices, in particular SiC-devices, with low on-state resistance or comparatively low forward-voltage drop, low leakage current, and high avalanche- and surge current stability.

The method is typically performed such that, in a sectional plane substantially perpendicular to the first surface 15, a plurality of spaced apart p-doped second semiconductor regions 2 in ohmic contact with the first metallization 8 are formed which form respective first pn-junctions 11 with the first semiconductor layer 1 and substantially extend to the first surface 15, and that in the sectional plane, a plurality of closed second pn-junctions 13 are formed in the n-doped first semiconductor layer 1 which are spaced apart from the first pn-junctions 11 so that, in a projection onto the first surface 15, at least a portion of each of second pn-junctions 13 is arranged between a pair of adjacent first pn-junctions. In the projection onto the first surface 15, the second pn-junctions 13 may partly overlap with to first pn-junctions 11.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific FIG. may be combined with features of other Figures, even in those cases in which this has not explicitly been mentioned. Such modifications to the inventive concept are intended to be covered by the appended claims.

Spatially relative terms such as "under," "below," "lower," "over," "upper" and the like are used for ease of description to explain the positioning of one element relative to a second element. These terms are intended to encompass different orientations of the device in addition to different orientations than those depicted in the Figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A vertical semiconductor device, comprising:
   a semiconductor body having a first surface and a second surface that runs substantially parallel to the first surface;
   a first metallization arranged on the first surface; and
   a second metallization arranged on the second surface;
   wherein, in a sectional plane substantially perpendicular to the first surface, the semiconductor body comprises:
   an n-doped first semiconductor region in ohmic contact with the second metallization; a plurality of p-doped second semiconductor regions in ohmic contact with the first metallization, substantially extending to the first surface, spaced apart from one another and forming respective first pn-junctions with the first semiconductor region; and
   a plurality of p-doped embedded semiconductor regions, spaced apart from one another, from the p-doped second semiconductor regions, from the first surface and from the second surface, and forming respective second pn-junctions with the first semiconductor region,
   wherein the p-doped embedded semiconductor regions are spaced apart from one another and from the second surface by a portion of the n-doped first semiconductor region having a substantially uniform doping concentration.

2. The vertical semiconductor device of claim 1, wherein at least one current path runs in the semiconductor body from the first metallization to the second metallization only through n-doped semiconductor regions.

3. The vertical semiconductor device of claim 1, wherein at least one of the p-doped embedded semiconductor regions partly overlaps with two of the second semiconductor regions when seen from above.

4. The vertical semiconductor device of claim 1, wherein the p-doped embedded semiconductor regions are in ohmic contact with the first metallization.

5. The vertical semiconductor device of claim 1, further comprising a third metallization arranged on the first surface and in ohmic contact with the first semiconductor region.

6. The vertical semiconductor device of claim 1, wherein a space charge region extends at least between adjacent second pn-junctions when a voltage difference is applied between the second metallization and the first metallization so that the second pn-junctions are reverse biased.

7. The vertical semiconductor device of claim 1, wherein a space charge region extends at least between adjacent first pn-junctions when a voltage difference is applied between the second metallization and the first metallization so that the first pn-junctions are reverse biased.

8. The vertical semiconductor device of claim 1, wherein adjacent second pn-junctions, in a direction running substantially parallel to the first surface, are at a second minimum distance, such that a space charge region extends at least between the adjacent second pn-junctions, when a non-negative voltage difference is applied between the second metallization and the first metallization.

9. The vertical semiconductor device of claim 1, wherein adjacent first pn-junctions are, in a direction running substantially parallel to the first surface, at a first minimum distance that is larger than about 100 nm, or wherein adjacent second pn-junctions are, in the direction running substantially parallel to the first surface, at a second minimum distance which is larger than about 100 nm, or wherein both the first minimum distance and the second minimum distance are larger than about 100 nm.

10. The vertical semiconductor device of claim 1, wherein the semiconductor body is comprised of a semiconductor material that has a band-gap higher than about two electron volts.

11. The vertical semiconductor device of claim 1, wherein the n-doped first semiconductor region comprises at least one of:
   an n-doped current-spread portion forming at least a part of the first pn-junctions and forming at least a part of the second pn-junctions;
   an n-doped drift portion having a lower maximum doping concentration than the current-spread portion, and arranged between the current-spread portion and the second metallization;
   an n-doped first contact portion having a higher maximum doping concentration than the current-spread portion, arranged between a pair of adjacent p-doped second semiconductor regions, and arranged between the current-spread portion and the first metallization;
   an n-doped embedded portion completely embedded in the current-spread portion, and having a higher maximum doping concentration than the current-spread portion; and
   an n-doped second contact portion having a higher maximum doping concentration than the drift portion and arranged between the drift portion and the second metallization.

12. An n-channel semiconductor diode, comprising:
   a semiconductor body comprising a semiconductor material that has a band-gap higher than about two electron volts and extending between a first surface and a second surface which runs substantially parallel to the first surface;
   an anode metallization arranged on the first surface; and
   a cathode metallization arranged on the second surface;
   wherein, in a sectional plane substantially perpendicular to the first surface, the semiconductor body comprises:

an n-doped first semiconductor region in ohmic contact with the cathode metallization;

at least two p-doped second semiconductor regions in ohmic contact with the anode metallization, spaced apart from one another, and forming respective first pn-junctions with the first semiconductor region; and at least one p-doped embedded semiconductor region in ohmic contact with the anode metallization, forming a second pn-junction with the first semiconductor region, and arranged in a direction substantially perpendicular to the first surface between the second surface and the at least two p-doped second semiconductor regions, wherein at least a portion of the at least one p-doped embedded semiconductor region is, in a projection onto the first surface, arranged between two of the at least two p-doped second semiconductor regions.

13. The n-channel semiconductor diode of claim 12, wherein the second semiconductor regions substantially extend to the first surface.

14. The n-channel semiconductor diode of claim 12, wherein at least one current path runs in the semiconductor body from the anode metallization to the cathode metallization only through n-doped semiconductor regions.

15. The n-channel semiconductor diode of claim 12, wherein the semiconductor body comprises in the sectional plane a plurality of second semiconductor regions forming a first lattice and a plurality of embedded semiconductor regions forming a second lattice.

16. A vertical semiconductor device, comprising:

a semiconductor body having a first surface and a second surface that runs substantially parallel to the first surface;

a first metallization arranged on the first surface; and a second metallization arranged on the second surface;

wherein, in a sectional plane substantially perpendicular to the first surface, the semiconductor body comprises:

an n-doped first semiconductor region in ohmic contact with the second metallization; a plurality of p-doped second semiconductor regions in ohmic contact with the first metallization, substantially extending to the first surface, spaced apart from one another and forming respective first pn-junctions with the first semiconductor region; and a plurality of p-doped embedded semiconductor regions, spaced apart from one another, from the p-doped second semiconductor regions, from the first surface and from the second surface, and forming respective second pn-junctions with the first semiconductor region, wherein the p-doped embedded semiconductor regions are in ohmic contact with the first metallization.

\* \* \* \* \*